US012584950B2

(12) United States Patent
Schwerdtfeger et al.

(10) Patent No.: US 12,584,950 B2
(45) Date of Patent: Mar. 24, 2026

(54) POSITIONING APPARATUS FOR POSITIONING A DEVICE UNDER TEST

(71) Applicant: Rohde & Schwarz GmbH & Co. KG, Munich (DE)

(72) Inventors: Constantin Schwerdtfeger, Munich (DE); Stefan Schoetz, Kollnburg (DE); Stefan Apfelbeck, Ranzing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 125 days.

(21) Appl. No.: 18/531,999

(22) Filed: Dec. 7, 2023

(65) Prior Publication Data

US 2025/0189569 A1  Jun. 12, 2025

(51) Int. Cl.
*G01R 29/08* (2006.01)
*G01R 29/10* (2006.01)
*G01R 31/28* (2006.01)

(52) U.S. Cl.
CPC ..... *G01R 29/0864* (2013.01); *G01R 31/2837* (2013.01); *G01R 29/105* (2013.01)

(58) Field of Classification Search
CPC ............ G01R 31/2887; G01R 31/2808; G01R 31/2893
USPC .......................... 324/750.16, 756.01, 757.01
See application file for complete search history.

(56) References Cited

U.S. PATENT DOCUMENTS

| | | | | | |
|---|---|---|---|---|---|
| 7,960,992 | B2 * | 6/2011 | Co | ......................... | G11C 29/56 324/757.01 |
| 8,971,821 | B2 * | 3/2015 | Schlub | ............... | G01R 29/0857 455/67.11 |

| | | | | | |
|---|---|---|---|---|---|
| 10,484,110 | B2 * | 11/2019 | Vikstedt | ................ | H04W 24/06 |
| 11,280,822 | B2 | 3/2022 | Pabst | | |
| 2008/0186015 | A1 * | 8/2008 | Osakabe | ............ | G01R 31/2893 324/756.07 |
| 2010/0097075 | A1 * | 4/2010 | Sze | .................... | G01R 31/2893 324/555 |
| 2011/0057674 | A1 * | 3/2011 | Weissacher | ........ | G01R 31/2891 324/750.16 |
| 2011/0084887 | A1 * | 4/2011 | Mow | ...................... | G01R 29/10 343/703 |
| 2013/0093447 | A1 * | 4/2013 | Nickel | ................... | G01R 29/10 324/750.16 |
| 2013/0181576 | A1 * | 7/2013 | Shiozawa | ............ | H02N 2/0095 310/323.17 |
| 2018/0217200 | A1 * | 8/2018 | Dehmel | ............. | G01R 31/2808 |
| 2020/0264223 | A1 | 8/2020 | Pabst | | |
| 2022/0291271 | A1 * | 9/2022 | Moreira | ................... | H04B 5/73 |
| 2024/0069082 | A1 * | 2/2024 | Jacob | ................. | G01R 29/0878 |

FOREIGN PATENT DOCUMENTS

EP          3699611 A1     8/2020

* cited by examiner

*Primary Examiner* — Roberto Velez

(74) *Attorney, Agent, or Firm* — Westman, Champlin & Koehler, P.A.

(57) ABSTRACT

The present invention relates to a positioning apparatus for positioning a device under test—DUT—, the positioning apparatus comprising: a support structure extending over an horizontal plane, and a mast structure, which is elongated in shape and configured to contact the support structure, wherein the mast structure is movable along a pivoting axis between a first position, where the mast structure is perpendicular to the horizontal plane, and a second position, where the mast structure is parallel to the horizontal plane.

4 Claims, 3 Drawing Sheets

POSITIONING APPARATUS FOR POSITIONING A DEVICE UNDER TEST

TECHNICAL FIELD

The present invention relates to a positioning apparatus, in particular a multi-axis rotary positioning apparatus for testing wireless-enabled devices. The invention further relates to a method for installing a device under test on a positioner and a radiofrequency test instrument comprising said positioning apparatus.

BACKGROUND OF THE INVENTION

The characterization of radiofrequency wireless-enabled devices, i.e., the determination of their radiation patterns, is a commonplace tool used for research, problem diagnostics and debugging, as well as for product certification, in order to make sure that a device meets all the required specifications before it is launched on the market.

The measurement of the radiation patterns are established through a number of radiation tests, which take place typically inside diagnostic anechoic chambers. These test chambers are equipped with one or more probe antennas and a positioner, where the device under test (DUT) can be attached and moved to the different working positions needed for the test to be performed. There exist different positioners in the market, with different sizes, geometry and movement axes for the rotation of a DUT.

In order to attach a DUT to the positioner, in many cases the installer has to go inside the diagnostic chamber. This normally requires a number of extra steps. For instance, the absorbers with which diagnostic chamber are equipped might have to be removed or at least protected. Additionally, there are a number of security measures (e.g., related to fire prevention and personal protection) that have to be met before an installer can enter a diagnostic chamber.

The situation gets more complicated for such DUTs that are comparably heavy or bulky. In these situations, the transportation of the devices for its installation can require the aid of a lifting table or of a small crane. This entails a considerable effort in terms of time, human and technical resources, and increases the downtime of the diagnostic chamber.

SUMMARY OF THE INVENTION

Against this background, there is the need to provide a mechanism that simplifies the installation and de-installation of a device under test on a positioner.

Accordingly, the present invention provides a positioning apparatus, a method and a radiofrequency test instrument having the features of the independent claims.

A first aspect of the invention provides a positioning apparatus for positioning a device under test—DUT—, the positioning apparatus comprising: a support structure extending over an horizontal plane, and a mast structure, which is elongated in shape and configured to (mechanically) contact the support structure, wherein the mast structure is movable along a pivoting axis between a first position, where the mast structure is perpendicular to the horizontal plane, and a second position, where the mast structure is parallel to the horizontal plane.

The support structure of the positioning apparatus for positioner) can be any structure extending in the horizontal, e.g. a turntable, while the mast structure (or holder structure) can be any structure extending in the vertical direction. The mast structure can be an arm-shaped structure for the clamping or holding of a device under test. According to the principles of the invention, the mast structure can be rotated up to 90° with respect to the support structure along a swiveling or pivoting axis, such that the mast structure is brought from a vertical position (first position) to a horizontal position (second position). The vertical position is a measurement position, i.e., the position that the mast structure adopts for the radiation measurements to be performed. The horizontal position is an installation position, i.e., a position of the mast structure for the clamping or attachment of a device under test.

According to a second aspect, the invention provides a radiofrequency (RF) test instrument, comprising: a test chamber for receiving and testing a device under test—DUT—; and a positioning apparatus for positioning a device under test—DUT—, the positioning apparatus comprising a support structure extending over an horizontal plane, and a mast structure, which is elongated in shape and configured to (mechanically) contact the support structure. The mast structure is movable along a pivoting axis between a first position, where the mast structure is perpendicular to the horizontal plane, and a second position, where the mast structure is parallel to the horizontal plane. The mast structure is also slidable along a sliding axis parallel to the horizontal plane. The positioning apparatus is placed inside the test chamber and is adapted to move the mast structure along the sliding axis to bring at least part of the mast structure outside the test chamber.

The sliding axis is an axis that allows the mast structure to move along one direction on the horizontal plane of the support structure. The sliding axis is oriented such that the mast structure can be driven towards an exit of the test chamber.

The test chamber can be any shielding anechoic chamber, such as the ones used for the measurement of radiation patterns, especially one adapted for the measurement of heavy and bulky devices under test.

One of the main ideas underlying the present invention is to provide a positioning apparatus that is capable, through the operation of a pivoting axis, of bringing the holder part of a positioner from a vertical position, where the performance of the radiation measurements takes place, to a horizontal position, from where the installation and de-installation of a DUT can be eased. Additionally, the positioning apparatus can be allowed to move in a sliding axis, such that the holder part of the positioning apparatus can be driven towards the exit of a test chamber, inside which the positioner can be placed, thereby making the installation and de-installation of a DUT more comfortable for the installer. Here and in the following, the term device under test (DUT) has to be understood in a broad sense. It can, in particular, also encompass an antenna under test (AUT) or an equipment under test (EUT).

The positioning apparatus and the radiofrequency test instrument as described above allow for a simple implementation of a method for installing/de-installing a DUT on/from a positioning apparatus placed inside a test chamber. The method comprises a number of steps. Initially, a positioning apparatus having a support and a mast structure is provided, with the features according to the second aspect of the invention. The mast structure of the positioning apparatus can be rotated along a pivoting axis and moved along a sliding axis parallel to the horizontal plane defined by the support structure. The mast structure is moved from a vertical to a horizontal position by rotating it along the pivoting axis. Additionally (at the same time, previously or afterwards) the mast structure can be moved along the sliding axis, such that at least part of the mast structure is brought outside of the test chamber, where the DUT can be installed.

In particular, this method may be carried out with the positioning apparatus according to the first aspect of the invention and/or with the radiofrequency test instrument according to the second aspect of the invention. The features and advantages disclosed herein in connection with the positioning apparatus of the invention are therefore also disclosed for the method, and vice versa.

The method outlined above refers to the installation of a device under test (DUT) on a positioning apparatus. A corresponding method for the de-installation of a DUT from a positioning apparatus can be carried out by performing steps analogous to the ones described above, by replacing the installing step by a de-installing step.

One advantage of the present invention is that the installation and de-installation of a DUT can be done in a horizontal position thanks to the rotation of the mast structure of the positioning apparatus along a pivoting axis. This simplifies the installation procedure, especially for heavy and bulky devices under test, which are difficult to hold and carry.

Another advantage of the present invention is that the installation and de-installation of the DUT can be performed outside of the test chamber. This provides a more comfortable environment for the installation and de-installation. Additionally, by not having to enter the test chamber, no arrangements have to be undertaken (e.g., temporary removal of the absorbers or the enforcement of additional protection and prevention security measures).

Advantageous embodiments and further developments follow from the dependent claims as well as from the description of the different preferred embodiments illustrated in the accompanying figures.

According to some embodiments, refinements, or variants of embodiments, the mast structure of the positioning apparatus can slide along a sliding axis parallel to the horizontal plane. This sliding axis allows the mast structure of the positioning apparatus to move along a direction on the plane defined by the support structure. If the support structure is a turntable, the mast structure can then be moved along a radial direction on the support structure.

According to some embodiments, refinements, or variants of embodiments, the support structure comprises a slidable piece to which the mast structure is attached. The slidable piece is further adapted to move along the sliding axis. The slidable piece can therefore define an initial position for the mast structure (e.g. a position close to the border of the support structure, which can also correspond to the position adopted by the mast structure for the measurement tests to be performed) and different other positions, some of them potentially outside of the border of the support structure, when the slidable piece this permits. Depending on how long the slidable piece is, and where the attachment to the mast structure takes place, the mast structure can thus be slid to the radial border of the support structure or even beyond.

According to some embodiments, refinements, or variants of embodiments, the mast structure is configured such that a movement of the mast structure along the sliding axis can be operated manually or with a motor, in particular a servomotor. The deployment of a motor makes the movement of the mast structure easier to handle. A manual operation can, in turn, simplify the security requirements (e.g., the use of a motor might require to install thermal sensors on the positioning apparatus).

According to some embodiments, refinements, or variants of embodiments, the motor is a servomotor which is adapted to provide a first locking position and a second locking position for the movement of the mast structure along the sliding axis. The first locking position can correspond to the minimal extension of the mast structure along the sliding axis, while the second locking position can correspond to the optimal position to perform the installation or de-installation of the DUT. These positions can be predetermined depending on the size and characteristics of the test chamber and the location of the positioning apparatus therein.

According to some embodiments, refinements, or variants of embodiments, the mast structure is configured such that a movement of the mast structure along the pivoting axis can be operated with a motor, in particular a servomotor. As already discussed regarding the movement of the mast structure along the sliding axis, also along the pivoting axis the movement of the mast structure can be advantageously operated with a motor. In some embodiments of the invention, the movement along the sliding axis and the pivoting axis can be operated with a single servomotor, which can be controlled manually (e.g., through some activation buttons on a panel) or can be controlled with an operation software.

According to some embodiments, refinements, or variants of embodiments, the mast structure and the support structure are configured such that they can be rotated together along an azimuthal axis perpendicular to the horizontal plane. The positioner can be moved along axes other than the sliding axis and the pivoting axis. In particular, the positioning apparatus can comprise a rotational positioner, where the support structure can be rotated along the azimuthal axis between −180° and +180° with respect to an initial position, such that the radiation tests have a 360° scope for polar pattern measurements (e.g., a measurement of an antenna beam width).

According to some embodiments, refinements, or variants of embodiments, the positioning apparatus is a great circle cut (GCC) positioner. GCC positioners are the standard in several measurement applications regarding radiofrequency devices. With a GCC positioner, besides the rotation along the azimuth, the DUT is allowed to rotate around an axis perpendicular to the azimuth. With this arrangement, the measurement device inside the test chamber does not need to be moved (typically a measurement antenna). In these embodiments of the invention, the positioner is thus a four-axis positioner.

According to some embodiments, refinements, or variants of embodiments, the mast structure comprises a holding mechanism, which are adapted to hold and lock a DUT in a predefined position. In some further embodiments, the holding mechanism is a flange. In these embodiments, the attachment of the DUT to the mast structure is done with a single contact instead of with, e.g., a clamping device. This can provide, among other things, a minimal interaction surface between the holder and the DUT, which is of an advantage when testing, e.g., the over-the-air (OTA) performance of the DUT.

According to some embodiments, refinements, or variants of embodiments, the holding mechanism of the mast structure is positioned such that when the mast structure is in the second position, the holding mechanism is arranged parallel to the horizontal plane. The movement of the mast structure along the pivoting axis is so designed, that the side containing the holding mechanism is facing a vertical direction. In preferred embodiments, the holding mechanism is facing upwards, so that the DUT can be attached to the positioning apparatus in a horizontal position, with the mast structure carrying the weight of the DUT.

According to some embodiments, refinements, or variants of embodiments, the positioning apparatus further comprises a braking device, configured to slow down the movement of the mast structure along the pivoting axis. The braking device can comprise a hydraulic brake, such that the movement of the mast structure while carrying the DUT takes place smoothly.

According to some embodiments, refinements, or variants of embodiments, the support structure is configured such that it can be moved along a direction perpendicular the horizontal plane. The support structure can thereby be elevated or lifted in order to adjust the height of the mast structure for the installation or de-installation of the DUT. Alternatively, this extra axis can be used to have more flexibility while performing the radiation measurements.

Where appropriate, the above-mentioned configurations and implementations can be combined with each other as desired, as far as this is reasonable.

Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

BRIEF DESCRIPTION OF THE DRAWINGS

The present invention is described in greater detail in the following on the basis of the embodiments shown in the schematic figures of the drawings, in which.

Figure 1:
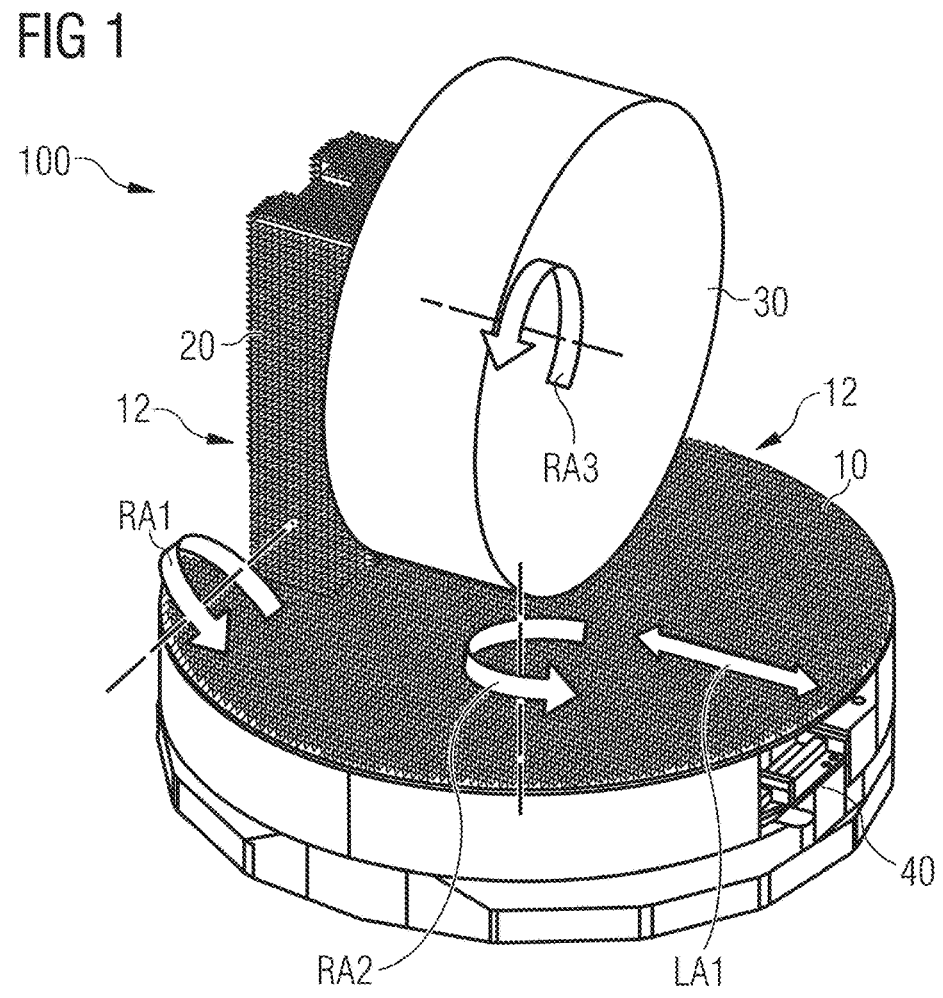
FIG. 1 is a schematic depiction of a positioning apparatus with the mast structure in a vertical position according to an embodiment of the present invention.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

The detailed description includes specific details for the purpose of providing a thorough understanding of the present invention. However, it will be apparent to those skilled in the art that the present invention may be practised without these specific details.

The numeration of the steps in the methods are meant to ease their description. They do not necessarily imply a certain ordering of the steps. In particular, several steps may be performed concurrently.

FIG. 1 shows a schematic depiction of a positioning apparatus 100 with the mast structure 20 in a vertical position according to an embodiment of the present invention.

The positioning apparatus 100 depicted in FIG. 1 comprises a support structure 10 and a mast structure 20.

The support structure 10 depicted in FIG. 1 is a turntable, i.e. a disk-shaped structure that can rotate around an azimuthal axis RA2 360 degrees (from −180° to +180°). The support structure 10 can be endowed with a number of radiation absorbers 12 to improve the reliability of the radiation measurements. The support structure 10 can also comprise additional elements, for instance elements for an elevation or for a tilt of the turntable (not shown in the figure). The support structure 10 is arranged such that it extends over a horizontal plane (whose normal is the azimuthal axis RA2).

The mast structure 20 in FIG. 1 is an elongated arm that extends in a vertical direction, i.e., in the direction of the azimuthal axis RA2. The mast structure 20 can be covered with a number of radiation absorbers 12. The mast structure 20 stays in contact with the support structure 10 and is adapted to hold a device under test 30. The size and length of the mast structure 20 depend on the characteristics of the device under test 30. In general, the size of the positioning apparatus 100 has to be adapted to the devices under test 30 whose radiation patterns are to be measured.

The mast structure 20 comprises a holding mechanism (e.g., a clamping mechanism or an attachment mechanism). This holding mechanism is adapted to provide a rotation axis RA3 for the device under test 30. With the arrangement shown in FIG. 1, the positioning apparatus 100 is a great-circle-cut (GCC) positioner with an azimuthal axis RA2 and a rotation axis RA3.

The mast structure 20 can be further moved along a pivoting axis RA1 from the first position shown in FIG. 1 to a second position (see FIG. 2) through a 90° rotation. A possible realization of this rotation of the mast structure 20 around the pivoting axis RA1 can be achieved by attaching the mast structure 20 to the support structure 10 with a hinge, placed on the outer side of the mast structure 20, and an interlocking mechanism, placed on the inner side of the mast structure 20. Whenever a rotation along the pivoting axis RA1 is wanted, the interlocking mechanism can be released and the mast structure 20 can be rotated with the hinge.

Figure 2:
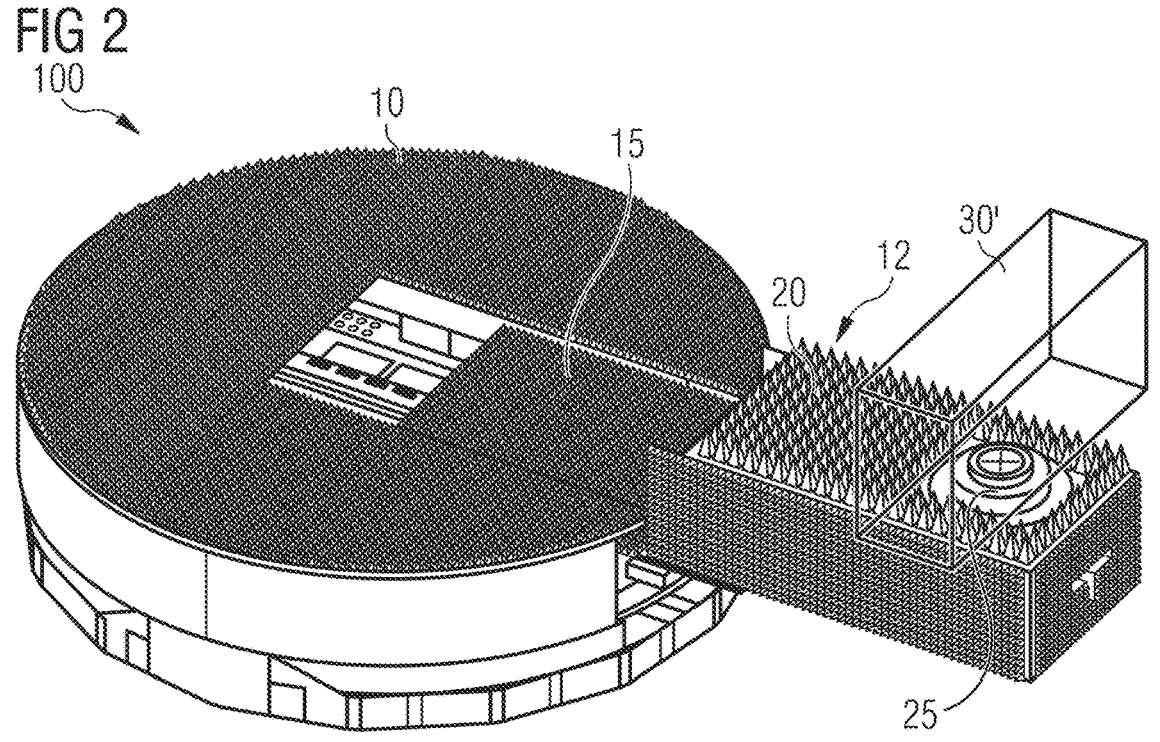
FIG. 2 is a schematic depiction of a positioning apparatus with the mast structure in a horizontal position according to another embodiment of the present invention.

In some embodiments of the invention, the mast structure 20 can be moved along a sliding axis LA1 (see the description regarding FIG. 2).

FIG. 1 also shows a servomotor 40, which is installed in the support structure 20 and can be adapted to control and operate the movement of the mast structure 20 along the pivoting axis RA1 and/or along the sliding axis LA1. In some embodiments of the invention, one or both movements can be operated manually. In some other embodiments, the servomotor can be controlled by an operator (for instance through buttons on a serial interface control or through a computer interface). In some embodiments of the invention, the movement of the mast structure 20 can be automated through software.

FIG. 2 shows a schematic depiction of a positioning apparatus 100 with the mast structure 20 in a horizontal position according to another embodiment of the present invention. FIG. 2 shows the mast structure 20 after a rotation of 90° with respect to the position shown in FIG. 1 has been performed. (In comparison with FIG. 1, the positioning apparatus 100 shown in FIG. 2 has been rotated 180° along the azimuthal axis RA2). The mast structure 20 has a flange 25, with which it is holding a device under test 30'. The flange 25 can be adapted to rotate (e.g., with a motor) the device under test 30' along the rotation axis RA3 shown in FIG. 1.

The support structure 10 of FIG. 2 comprises a slidable piece 15, to which the mast structure 20 is attached. The slidable piece 15 can be moved along the sliding axis LA1, carrying with it the mast structure 20. The movement of the slidable piece 15 can be controlled with a motor 40.

Figure 3:
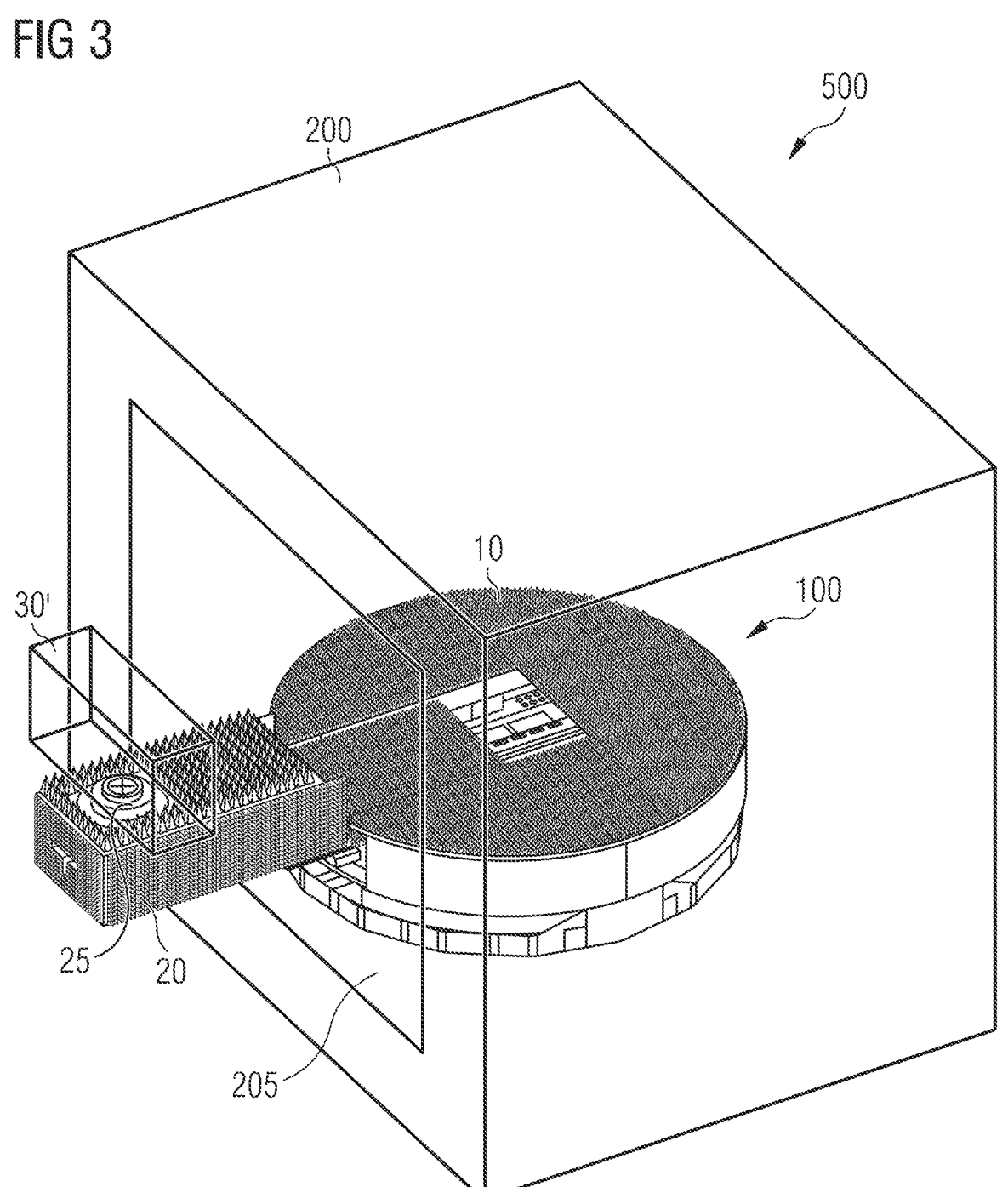
FIG. 3 is a schematic representation of the radiofrequency test instrument according to the second aspect of the invention, comprising a positioning apparatus according to an embodiment of the first aspect of the present invention and a test chamber.

FIG. 3 shows a schematic representation of a radiofrequency test instrument 500 according to the second aspect of the invention, comprising a positioning apparatus 100 according to an embodiment of the first aspect of the present invention and a test chamber 200. The radiofrequency test instrument 500 can also comprise a communication tester and a serial interface (not shown in the figure) for the generation of testing signals inside the test chamber 200 and for controlling the measurement procedure and movement of the device under test 30'.

The test chamber 200 can be any shielding anechoic chamber, such as the ones conventionally used for the characterization of the radiation pattern of wireless-enabled devices, such as the device under test 30' shown in FIG. 3. Such tests can comprise, e.g., over-the-air (OTA) measurements and radiated spurious emission (RSE) measurements. The test chamber 200 has an entrance 205, which can be sealed with a door (not shown in the figure). The test chamber 200 is not necessarily shown to scale with respect to the positioning apparatus 100.

FIG. 3 shows schematically the use of the positioning apparatus 100 of the invention to solve the problem of how to install and de-install the device under test 30' from the positioning device 100 in a comfortable way, with the flange 25 facing upwards, and without the need to enter the test chamber 200.

During the radiation measurements to be performed inside the test chamber 200, the positioning apparatus 100 is placed completely inside the test chamber 200, which is sealed with a door. As soon as a device under test 30' is to be measured, the door is unlocked and opened.

The flange 25 can then be brought to the position shown in FIG. 3 by moving the mast structure 20 around the pivoting axis RA1 from a first position (see FIG. 1), to the second position illustrated in FIG. 3, where it stays on the horizontal. Additionally, the mast structure 20 can be moved along the sliding axis LA1, possibly with the help of a slidable piece 15 of the support structure 10. These two movements, or just one of them, can be operated with a motor, in particular a servomotor 40, such as the one described in relation with FIGS. 1 and 2.

Depending on the characteristics of the test chamber 200 and the positioning apparatus 100, the servomotor 40 can be programmed to provide two locking positions for the mast structure 20 along the sliding axis LA1: a first locking position, in which the mast structure 20 is inside the test chamber 200 and radiation measurements can be performed (a measurement position); and a second locking position, in which at least part of the mast structure 20, in particular a flange 25, is brought outside of the test chamber 200 for the installation and de-installation of the device under test 30' (installation position). In order to ease the installation and de-installation, the support structure 10 can be elevated, e.g., in order to reach a comfortable height for an operator/installer.

The servomotor 40 can also comprise a braking device, adapted to slow down the movement of the mast structure 20 along the pivoting axis RA1. This is especially advantageous to avoid abrupt movements when the mast structure 20 is holding the device under test 30'.

FIG. 3 illustrates either a moment right after the device under test 30' has been installed, or the moment right before the device under test 30' is to be de-installed.

The invention further provides a number of implementations, in which the different movements of the positioning apparatus 100 can be automated. In some embodiments of the invention, it is foreseen that an unlocking of the door of the test chamber 200 automatically initiates the movement of the mast structure 20 along the sliding axis LA1 and the pivoting axis RA1, until the mast structure 20 reaches a position where at least part of the mast structure 20, in particular the flange 25, is outside of the test chamber 200. Conversely, the locking of the door of the test chamber 200 can automatically lock the movement of the mast structure 20 along any of the pivoting axis RA1 and the sliding axis LA1.

Figure 4:
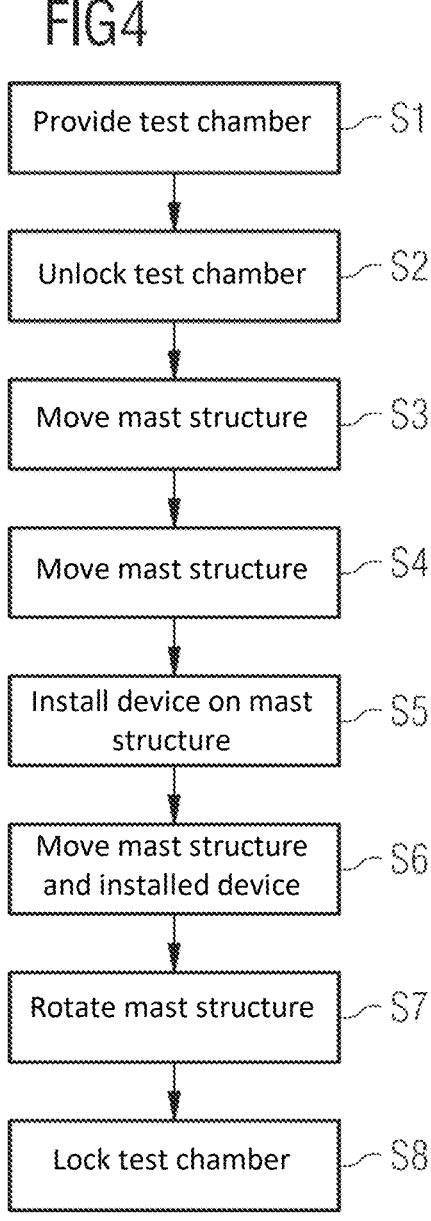
FIG. 4 is a flowchart showing an exemplary embodiment of a method for installing a device under test on positioning apparatus placed inside a test chamber according to an embodiment of the present invention.

FIG. 4 is a flowchart showing an exemplary embodiment of a method for installing a device under test 30, 30' on a positioning apparatus 100 placed inside a test chamber 200 according to an embodiment of the present invention. The method can be preferably implemented with the positioning apparatus 100 described with respect to FIGS. 1 and 2, and the radiofrequency test instrument 500 described in relation with FIG. 3. The method comprises a number of steps.

In a step S1, a test chamber 200 with a positioning apparatus 100 placed inside, such as the one described in FIG. 3, is provided. The positioning apparatus 100 has a support structure 10 and a mast structure 20 with the features discussed in relation with the description of FIGS. 1 and 2.

In a step S2, the test chamber is unlocked (e.g., its door is open), which automatically unlocks the movement of the mast structure 20 along any of the pivoting axis RA1 and the sliding axis LA1.

In another step S3, the mast structure 20 is moved along the pivoting axis RA1 from a first position, where the mast structure 20 is perpendicular to the support structure 10, to a second position, where the mast structure 20 is parallel to the support structure 10. This movement can be operated manually or with the aid of a motor.

In a subsequent step S4, at least part of the mast structure 20, in particular a holding mechanism for a device under test 30, 30', such as the flange 25 shown in FIGS. 2 and 3, is brought outside of the test chamber 200 by moving the mast structure 20 along the sliding axis LA1 from a position inside the test chamber to a position outside of the test chamber. This movement can be operated manually or with a motor. In some preferred embodiments of the invention, the initial and final positions are locked in order to ensure stability to the mast structure.

In a step S5, the device under test 30, 30' can be installed on the mast structure 20, in particular on the flange 25, while being outside of the test chamber 200. This can be done manually or with the aid of some machinery (e.g., a crane).

In a further step S6, the mast structure 20 with the installed device under test 30, 30' is moved along the sliding axis LA1 from the position outside of the test chamber 200 to a position inside the test chamber 200.

In a step S7, the mast structure 20 is rotated through the pivoting axis RA1 90° from the second position to the first position.

In a step S8, the test chamber is locked, which automatically causes the locking of the movement of the mast structure 20 along any of the pivoting axis RA1 and the sliding axis LA1.

After step S8 the radiation measurements of the device under test 30, 30' can be performed. When those measurements are completed and the device under test 30. 30' needs to be de-installed, steps S2 to S8 can be repeated, with the proviso that step S5 should be used to de-install the device under test 30, 30'. In some embodiments of the invention, the steps S6 and S7 can be performed concurrently, or one after the other (S6 after S7, or S7 after S6). The same consideration applies to steps S3 and S4. Accordingly, the moving of the mast structure 20 along the pivoting axis RA1 can take place inside or outside of the test chamber 200.

The previous description of the disclosed embodiments are merely examples of possible implementations, which are provided to enable any person skilled in the art to make or use the present invention. Various variations and modifications of these embodiments will be readily apparent to those skilled in the art, and the generic principles defined herein may be applied to other embodiments without departing from the spirit or scope of the present disclosure. Thus, the present invention is not intended to be limited to the embodiments shown herein but it is to be accorded the widest scope consistent with the principles and novel features disclosed herein. Therefore, the present invention is not to be limited except in accordance with the following claims.

What is claimed is:

1. A radiofrequency (RF) test instrument, the RF test instrument comprising:

a test chamber for receiving and testing a device under test (DUT); and a positioning apparatus for positioning a device under test (DUT), the positioning apparatus comprising a support structure extending over an horizontal plane, and a mast structure, which is elongated in shape and configured to contact the support structure, wherein the mast structure is movable along a pivoting axis between a first position, where the mast structure is perpendicular to the horizontal plane, and a second position, where the mast structure is parallel to the horizontal plane, and wherein the mast structure is slidable along a sliding axis parallel to the horizontal plane;

wherein the positioning apparatus is placed inside the test chamber and is adapted to move the mast structure along the sliding axis to bring at least part of the mast structure outside the test chamber.

2. The RF test instrument of claim 1, wherein the mast structure further comprises a holding mechanism, adapted to hold and lock the device under test in a predetermined position, and wherein the positioning apparatus is adapted to move the mast structure along the sliding axis to bring at least the holding mechanism outside of the test chamber.

3. The RF test instrument of claim 2, wherein the holding mechanism is a flange.

4. The RF test instrument of claim 1, further comprising a locking system adapted to lock the movement of the mast structure along any of the pivoting axis and the sliding axis while the test chamber is locked, and to unlock the movement of the mast structure along any of the pivoting axis and the sliding axis when the test chamber is unlocked.

* * * * *